United States Patent
Park

(10) Patent No.: US 6,610,998 B1
(45) Date of Patent: Aug. 26, 2003

(54) METHOD AND STRUCTURE FOR CRYSTALLIZING A FILM

(75) Inventor: Min Hwa Park, Chungcheongbuk-do (KR)

(73) Assignee: Goldstar Electron Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 09/577,823

(22) Filed: May 25, 2000

Related U.S. Application Data

(62) Division of application No. 08/895,884, filed on Jul. 17, 1997, now Pat. No. 6,130,120, which is a continuation of application No. 08/367,813, filed on Jan. 3, 1995, now Pat. No. 5,681,760.

(51) Int. Cl.[7] .................. H01L 21/84; H01L 29/786; H01L 29/04
(52) U.S. Cl. .................. 257/75; 257/66; 427/555; 427/557; 427/596
(58) Field of Search .................. 438/158, 166, 438/486, 487, 488, 535, 479, 795, FOR 333, FOR 334, FOR 418, FOR 419, 563; 427/554, 555, 596, 557; 148/DIG. 91, DIG. 92, DIG. 93, DIG. 94; 257/66, 75

(56) References Cited

U.S. PATENT DOCUMENTS

| | | |
|---|---|---|
| 4,463,028 A | 7/1984 | Laude |
| 4,628,589 A | 12/1986 | Sundaresan |
| 5,162,892 A | 11/1992 | Hayashi et al. |
| 5,438,014 A | 8/1995 | Hashimoto |
| 5,541,119 A | 7/1996 | Kodama |
| 5,656,556 A | 8/1997 | Yang |
| 5,858,473 A | 1/1999 | Yamazaki et al. |
| 5,858,559 A | 1/1999 | Barbour et al. |
| 5,888,841 A | 3/1999 | Synder |
| 6,101,232 A * | 8/2000 | Fossum et al. ............ 377/60 |

FOREIGN PATENT DOCUMENTS

| | | |
|---|---|---|
| JP | 59-21067 A | 2/1984 |
| JP | 6-333822 A | 12/1994 |
| JP | 63-292632 A | 11/1998 |

OTHER PUBLICATIONS

Wolf et al., Silicon Processing for the VLSI Era, vol. 1: Process Technology, Lattice Press, pp. 57–58 (1986).

* cited by examiner

*Primary Examiner*—Mary Wilczewski
(74) *Attorney, Agent, or Firm*—Birch, Stewart, Kolasch & Birch, LLP

(57) ABSTRACT

A method and structure for crystallizing film is disclosed. The method includes the steps of forming a film on a substrate, forming a lens on the film to focus an electromagnetic wave on the film and directing the electromagnetic wave on the film inclusive of the lens to crystallize the film.

9 Claims, 6 Drawing Sheets

NO GRAIN BOUNDARY
WHICH PASSES THROUGH
SOURCE "S" AND DRAIN "D"

METHOD AND STRUCTURE FOR CRYSTALLIZING A FILM

This application is a divisional of application Ser. No. 08/895,884, filed on Jul. 17, 1997, now U.S. Pat. No. 6,130,120 which is a continuation of application Ser. No. 08/367,813, filed Jan. 3, 1995, now U.S. Pat. No. 5,681,760; the entire contents of which are hereby incorporated by reference.

BACKGROUND OF THE INVENTION

The present invention relates to a method for manufacturing a thin film transistor, and more particularly to a method structure for crystallizing a film using a lens which is applicable to a SRAM (static random access memory) and liquid crystal display devices.

In the conventional method for manufacturing a thin film transistor, a bottom gate and a top gate are used. A polysilicon for forming a body layer is manufactured by enlarging the particle size using solid phase growing method. The solid phase growing method for the body polysilicon layer according to the conventional method is carried out by heat treating at about 600° C for about 24 hours.

Recently, an attempt to increase the crystallization degree by RTA (rapid thermal annealing) is made. However, this increases production cost and is difficult to proceed in batch type.

A plasma $H_2$ passivation used to be applied to obtain on/off current ratio ($I_{on}/I_{off}$) of $10^6$ or above.

The conventional method for manufacturing a thin film transistor will be described below referring to attached FIGS. 1a–1c.

First, a gate electrode 2 is formed by depositing a conductive material such as polysilicon on an insulating layer 1 formed on a substrate (not shown) and patterning; through photolithography as shown in FIG. 1a.

After then, a gate oxide 3 and a body polysilicon layer 4 are sequentially formed by CVD (chemical vapor deposition) on the whole surface of the insulating layer 1 in which the gate electrode 2 is formed, and channel ions are implanted.

As shown in FIG. 1b, photoresist 5 is coated on the body polysilicon layer 4 and is selectively exposed and developed to form a prescribed photoresist pattern to define a channel region and an offset region on the body polysilicon layer 4. At this time, the region covered with the photoresist 5 becomes the channel region and the offset region. Ion implantation is carried out to form an LDD (lightly doped drain) region 11 using the photoresist pattern 5 defining the channel region and the offset region as an ion implantation mask.

As shown in FIG. 1c, the photoresist pattern 5 defining the channel region and the offset region is removed and then photoresist 6 is coated again, selectively exposed and developed to form a photoresist pattern 6 defining a source region and a drain region. Ion implantation is carried out using this photoresist pattern 6 as a mask to form the source region and the drain region 12 to complete the manufacture of the thin film transistor as shown in FIG. 1c.

FIG. 2 is a schematic cross-sectional view of the channel region formed on the body polysilicon layer 4 of the thin film transistor manufactured by the conventional method.

According to the conventional method, a problem of leakage current generation by the grain boundary A which passes through the source S and the drain D as shown in FIG. 2 occurs.

Moreover, since the offset region and the source and the drain region are defined using the photoresist, the length of the channel region and the length of the offset region are changed according to the degree of overlay misalignment, and stable device characteristic could be hardly obtained.

SUMMARY OF THE INVENTION

An object of the present invention is to solve the above-mentioned and other problems encountered in the conventional methods and to provide a method for manufacturing a thin film transistor having high reliance and high reproductivity.

Another object of the present invention is to provide a method and structure for crystallizing a film using a lens.

To accomplish the above and other objects, there is provided in the present invention a method for manufacturing a thin film transistor comprising the steps of forming a polysilicon layer on a substrate, forming an impurity-containing layer on the polysilicon layer, forming a prescribed pattern by patterning the impurity-containing layer, flowing the impurity-containing layer by heat treating and crystallizing the polysilicone layer by annealing using a prescribed light source.

Briefly described, the present invention is directed to a method for crystallizing a film, including steps of forming a film on a substrate; forming a lens on the film to focus an electro-magnetic wave onto the film; and directing the electromagnetic wave on the film inclusive of the lens to crystallize the film.

Furthermore, the present invention is directed to a structure for crystallizing a film, including: a film formed on a substrate, and a lens formed on a predetermined portion of the film to focus an electro-magnetic wave on the predetermined portion of the film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects and advantages of the present invention will become more apparent by describing in detail a preferred embodiment thereof with reference to the attached drawings in which.

DETAILED DESCRIPTION OF THE PREFERRED EMBODIMENTS

The present invention will be described in detail below referring to the attached drawings. FIGS. 3a–3f are views for illustrating a method and structure for crystallizing a film according to the present invention.

Figure 1A:
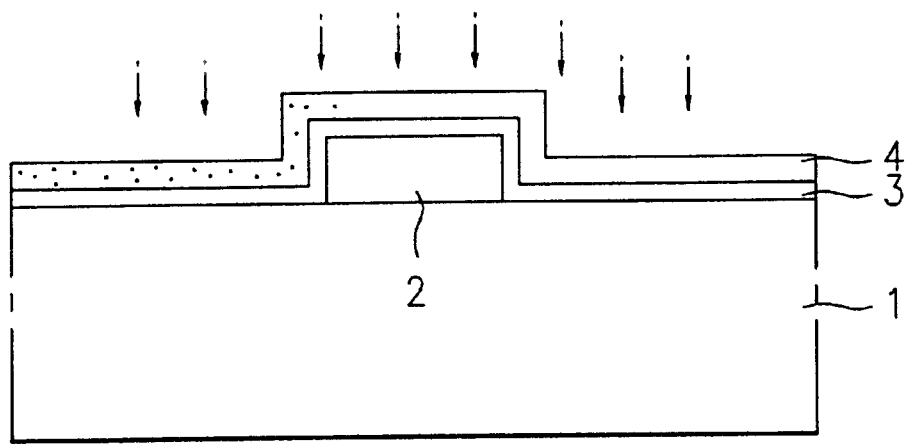
FIGS. 1a through 1d are sectional views for explaining the conventional method for manufacturing thin film transistor.
Figure 1B:
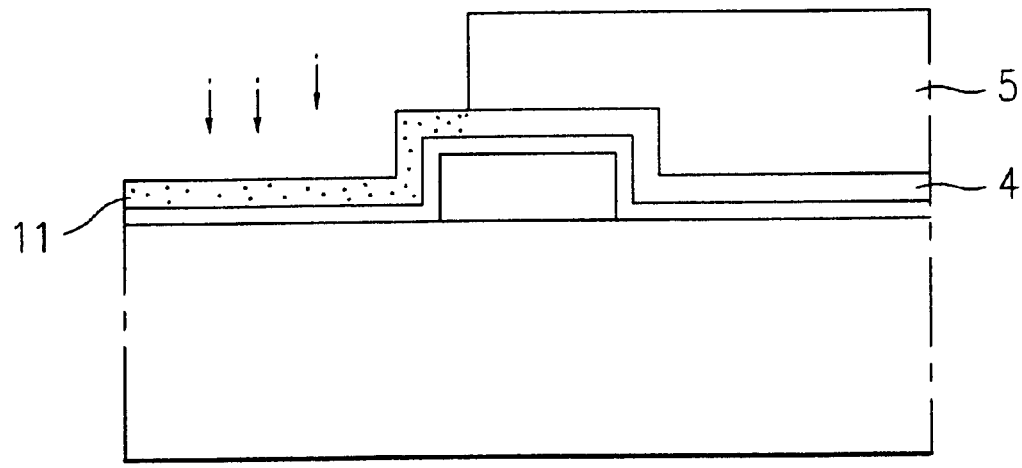
Figure 1C:
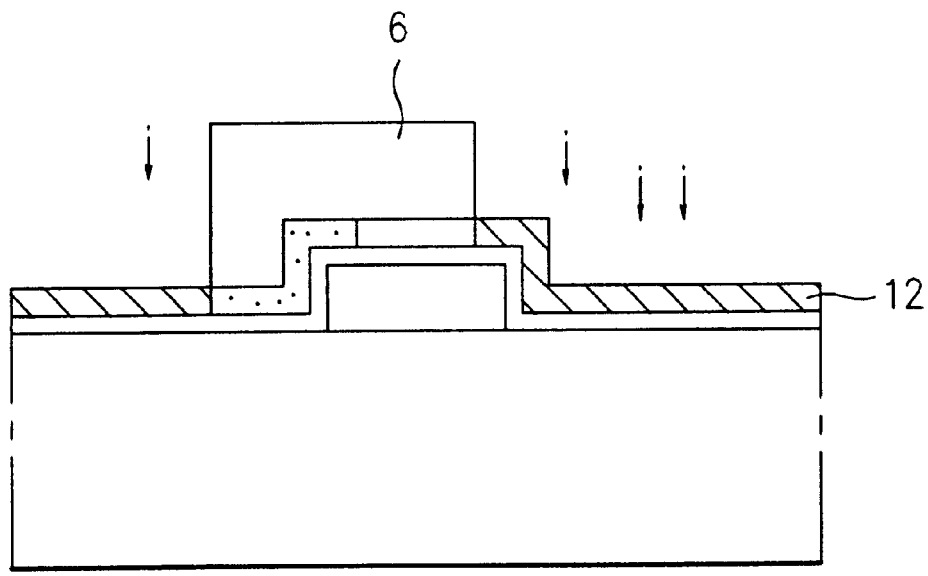
Figure 1D:
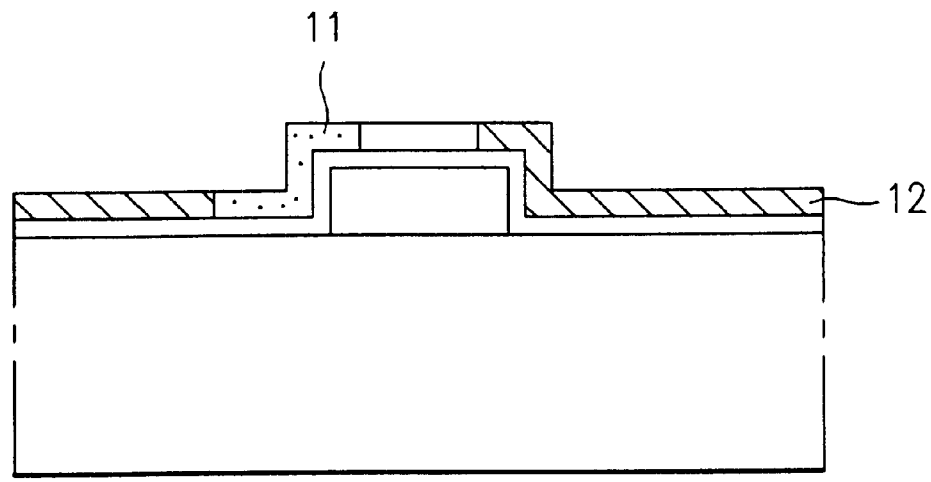
Figure 2:
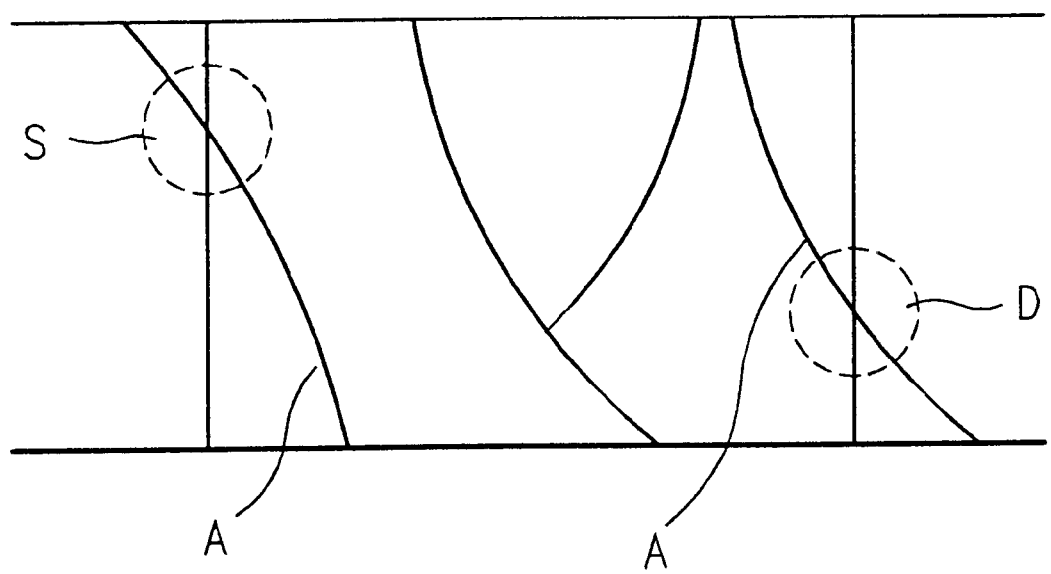
FIG. 2 is a schematic cross-sectional view at the portion of the channel of the thin film transistor manufactured by the conventional method.
Figure 3A:
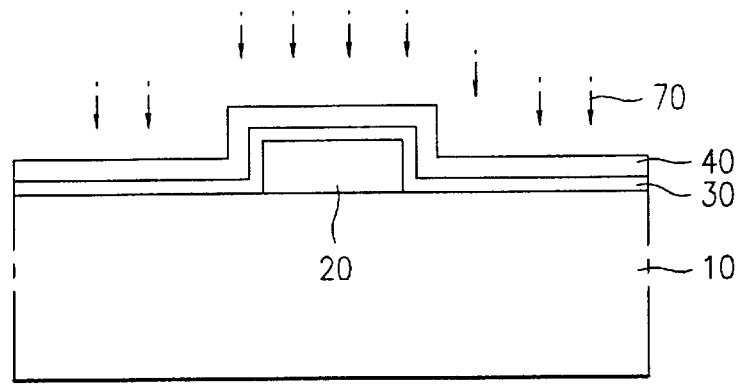
FIGS. 3a through 3f are perspective views for explaining a method for crystallizing a film according to the embodiments of the present invention.

First, a gate electrode 20 is formed by depositing a conductive material such as polysilicon on an insulating layer 10 formed on a substrate (not shown) and patterning it fusing photolithography as shown in FIG. 3a.

After then, a gate oxide 30 (gate insulating layer) and a body polysilicon layer 40 are sequentially formed by CVD (chemical vapor deposition) method on the whole surface of the insulating layer 10 where the gate electrode 20 is formed, and ion implantation 70 is carried out for forming a channel region.

Figure 3B:
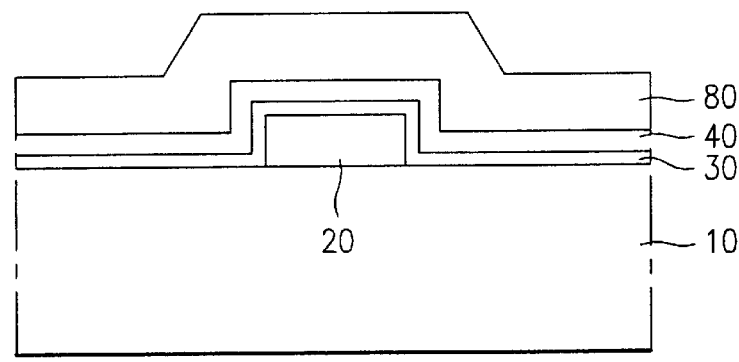

As shown in FIG. 3b, an impurity-containing layer such as BPSG 80 (borophospho-silicate glass in case of a P-type thin film transistor) or PSG 80 (phospho-silicate glass in case of an N-type thin film transistor) is deposited on the body polysilicon layer 40 using the CVD method. The BPSG layer (or the PSG layer) 80 is formed while controlling the thickness thereof according to the wavelength of the light source to be used in the following crystallization process. It is preferred that the BPSG layer 80 is formed by washing using SC-1 and HF after the channel ion implantation.

Figure 3C:
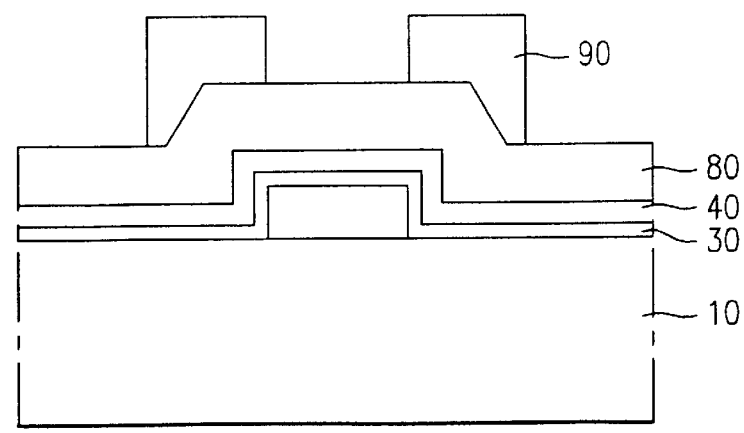

As shown in FIG. 3c, photoresist is coated on the BPSG layer 80 (or the PSG layer) and is patterned as photoresist pattern 90 photolithography to define a source region and a drain region. At this time, the portion covered with the photoresist pattern 90 becomes the source region and the drain region, while the body polysilicon layer portion exposed between the source region and the drain region becomes the channel region.

Figure 3D:
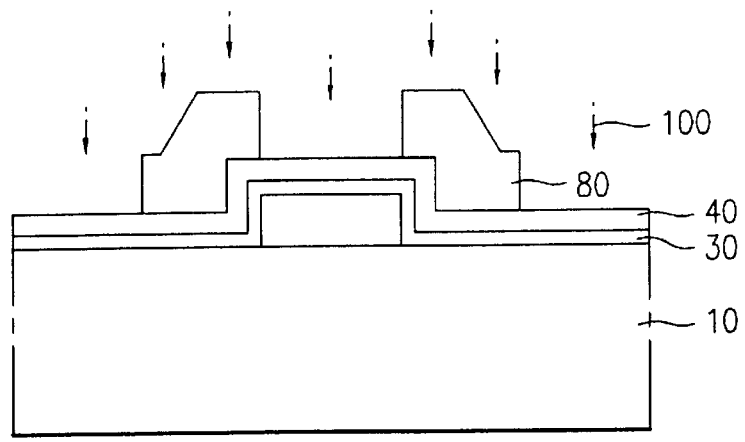
Figure 3E:
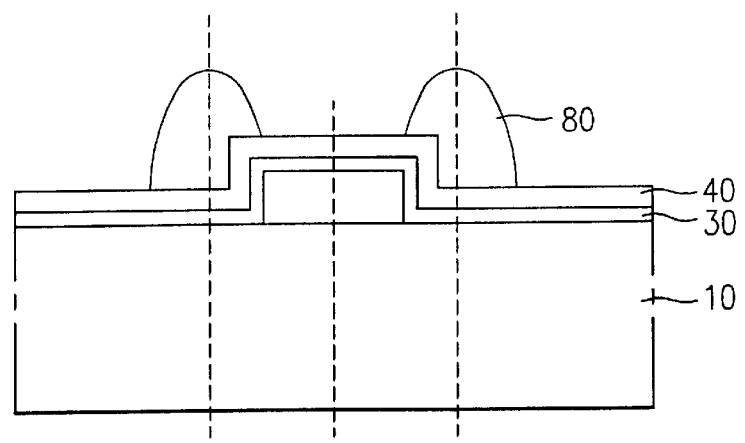

Next, as shown in FIG. 3d, the BPSG layer (or the PSG layer) 80 is etched using the photoresist pattern 90 as a mask. After removing the photoresist pattern 90, heat treatment is carried out for flowing the BPSG layer 80 (or the PSG layer) as shown in FIG. 3e. The body polysilicon layer 40 in the channel region is crystallized by annealing using a prescribed light source. For example, RTP (rapid thermal process) can be used or a focused laser which generates electro-magnetic waves can be used as the light source.

Meanwhile, since flowability of the BPSG (or the PSG) is changed according to the concentration of boron (or phosphorous) in the BPSG (or PSG), and the optimized radius of curvature of the flowed state of the BPSG (or PSG) is changed according to the wavelength of the light source used when crystallizing the channel region, the time and temperature of the heat treating of the BPSG layer should be appropriately controlled to obtain desirable flowability and the desired radius of curvature.

Figure 3F:
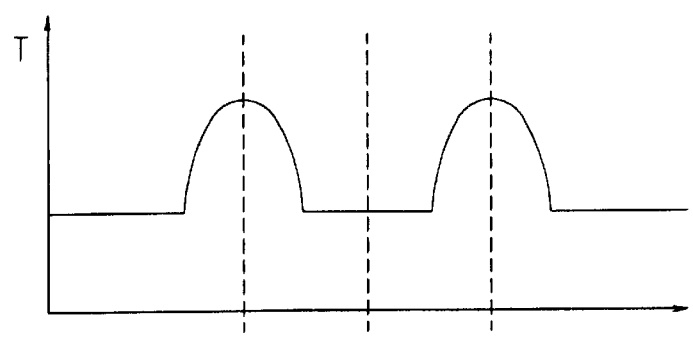

The impurity in the BPSG layer (or the PSG layer) 80 diffuses into the body polysilicon layer 40 during the heat treatment to form the source and the drain regions region while flowing the BPSG layer 80 (or the PSG layer) to form the shape as shown in FIG. 3e. Therefore, during crystallization of the body polysilicon layer, i.e. during forming the channel region, the BPSG layer 80 (or the PSG layer) plays the role of a micro-lens to give the temperature distribution as illustrated in FIG. 3f.

The partial temperature difference affects the nucleation and the growing rate during the crystallization of the amorphous silicon or polysilicon layer 40 and this results in the particle size at the interface of the source and the drain region and the channel region being larger than that at the channel region.

In conclusion, the grain boundary which passes through the boundary of the source and the drain region with the channel region can be effectively reduced or increased under the given thermal budget.

Figure 4:
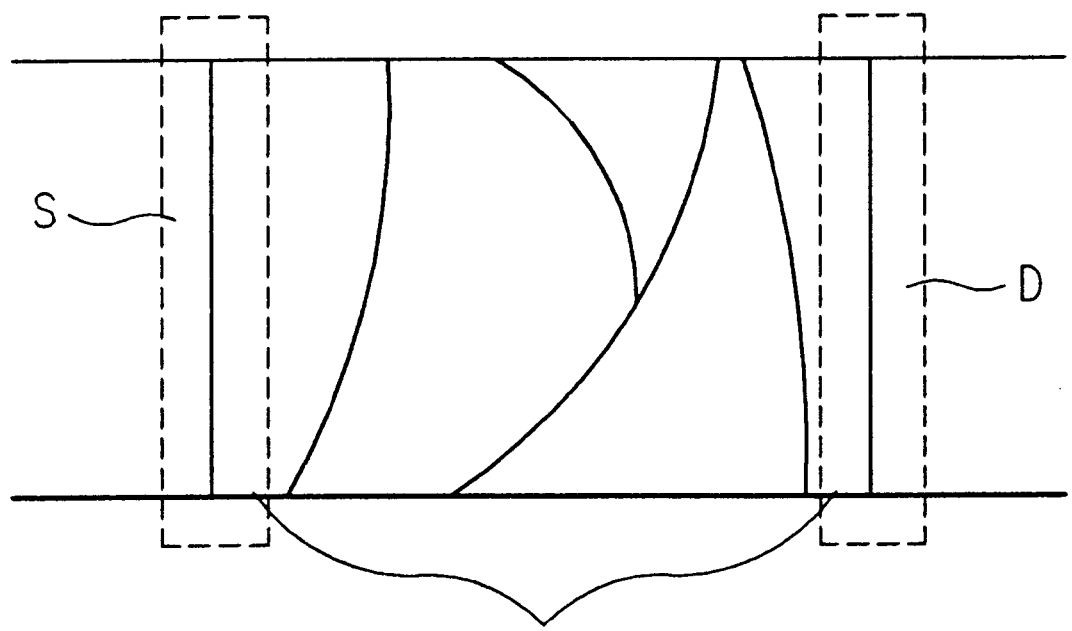
FIG. 4 is a schematic cross-sectional view at a portion of the channel of a thin film transistor manufactured by the method of the present invention.

FIG. 4 is a schematic cross-sectional view at a portion of the channel of a thin film transistor manufactured by the method of the present invention. No grain boundary which passes through the source region S and the drain region D is observed due to the partial temperature difference during the crystallization as described above.

During the process illustrated in FIG. 3d, ion implantation 100 to form an LDD structure could be carried out before heat treating the BPSG layer 80. In this case, if the ion implantation 100 is followed by the BPSG flowing, the offset region is defined by the difference in the lateral dimension range of the BPSG layer before and after the flowing, as shown in FIG. 3d and FIG. 3e.

The ion implantation for forming the source and the drain region, which has been carried out in the conventional method, can be replaced with the auto doping of boron (or phosphorous) from the BPSG layer (or the PSG layer) during the flowing of the BPSG layer (or the PSG layer) or during the annealing for crystallizing the channel region. In this method, the mask process for patterning the BPSG layer (or the PSG layer) is added, while the ion implantation process is eliminated. This is advantageous in simplifying the manufacturing process.

As described above, according to the present invention, the leakage current owing to the grain boundary which passes through the source region and the drain region can be largely reduced and the off current can be lowered. And since the source and drain region can be self-aligned formed, the change in channel length due to the overlay misalignment which may occur when forming the source and the drain region by photolithography using photoresist, can be basically eliminated.

Moreover, in case of applying the LDD structure, the length of the offset region due to the difference in the lateral dimension region of the BPSG layer (or the PSG layer) before and after the flowing can be reproductively controlled.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A structure for crystallizing a film, comprising:

a film formed on a substrate; and a micro-lens formed in contact with a predetermined portion of the film to focus an electro-magnetic wave on the predetermined portion of the film, causing said film to crystallize.

2. The structure for crystallizing a film as claimed in claim 1, wherein the film includes a recrystallizable material.

3. The structure for crystallizing a film as claimed in claim 2, wherein the recrystallizable material includes a semiconductor.

4. The structure for crystallizing a film as claimed in claim 2, wherein the semiconductor film includes one of polysilicon and amorphous silicon.

5. A structure for crystallizing a film, comprising:

a film formed on a substrate; and a micro-lens, formed of an impurity-containing layer, formed in contact with a predetermined portion of the film to focus an electromagnetic wave on the predetermined portion of the film.

6. The structure for crystallizing a film as claimed in claim 5, wherein the impurity-containing layer is one of a P-type impurity layer and an N-type impurity layer.

7. The structure for crystallizing a film as claimed in claim 5, wherein the impurity-containing layer includes one of a PSG film and a BSG film.

8. A structure for crystallizing a film, comprising:

a film formed on a substrate; and a micro-lens formed in contact with a predetermined portion of the film to focus an electromagnetic wave generated by a laser on the predetermined portion of the film.

9. A structure for crystallizing a film, comprising:

a film formed on a substrate; and a micro-lens formed in contact with a predetermined portion of the film to focus an electromagnetic wave on the predetermined portion of the film to create a partial temperature difference on the film.

* * * * *